United States Patent [19]

Saenz, Jr.

[11] 4,356,444

[45] Oct. 26, 1982

[54] TEST SYSTEM FOR CATHODIC PROTECTION CIRCUIT OF AN UNDERGROUND PIPELINE

[76] Inventor: Alfredo Saenz, Jr., 18643 Chestnut Ave., Country Club Hills, Ill. 60477

[21] Appl. No.: 216,385

[22] Filed: Dec. 15, 1980

[51] Int. Cl.³ .......................................... G01R 34/12
[52] U.S. Cl. ...................................... 324/54; 324/72; 324/425
[58] Field of Search .................. 324/54, 65 CR, 71 E, 324/425; 370/37

[56] References Cited

U.S. PATENT DOCUMENTS

| | | | |
|---|---|---|---|
| 2,974,276 | 3/1961 | Davis | 324/72 |
| 3,066,256 | 11/1962 | Rasor | 324/54 |
| 3,526,831 | 9/1970 | Smith | 324/54 |
| 3,735,249 | 5/1973 | Stoll | 324/72 |
| 3,753,091 | 8/1973 | Daspit | 324/54 |
| 3,991,363 | 11/1976 | Lathrop | 324/52 |
| 4,039,938 | 8/1977 | Link | 324/54 |
| 4,099,117 | 7/1978 | Erath | 324/54 |
| 4,134,061 | 1/1979 | Gudgel | 324/52 |
| 4,151,458 | 4/1979 | Seager | 324/72 |
| 4,228,399 | 10/1980 | Rizzo | 324/425 |

*Primary Examiner*—Michael J. Tokar

*Attorney, Agent, or Firm*—Zarley, McKee, Thomte, Voorhees & Sease

[57] ABSTRACT

An apparatus for testing the pipe-to-soil potential of a buried pipeline having a plurality of rectifiers electrically connected to it in spaced-apart intervals for applying an electrical potential to the pipe includes a plurality of interrupter units electrically connected to the rectifiers for turning them on and off at intervals. A clock reference unit is electrically connectable to each of the interrupters for synchronizing them for turning all of the rectifiers on and off in unison. A portable sensing device produces signals indicative of the pipe-to-soil potential of the pipe and directs these signals to a demultiplexer unit which is also synchronized with the clock reference unit for separating the signals corresponding to the ON and OFF potentials which are then separately recorded.

The method of the invention thus includes alternately turning each rectifier on and off, synchronizing the turning on and off of all of the rectifiers, producing signals indicative of the pipe-to-soil potential of the pipe at various positions therealong and separating the signals indicative of the ON and OFF potentials in synchronization with the rectifiers so that the ON and OFF potentials may be separately recorded.

11 Claims, 7 Drawing Figures

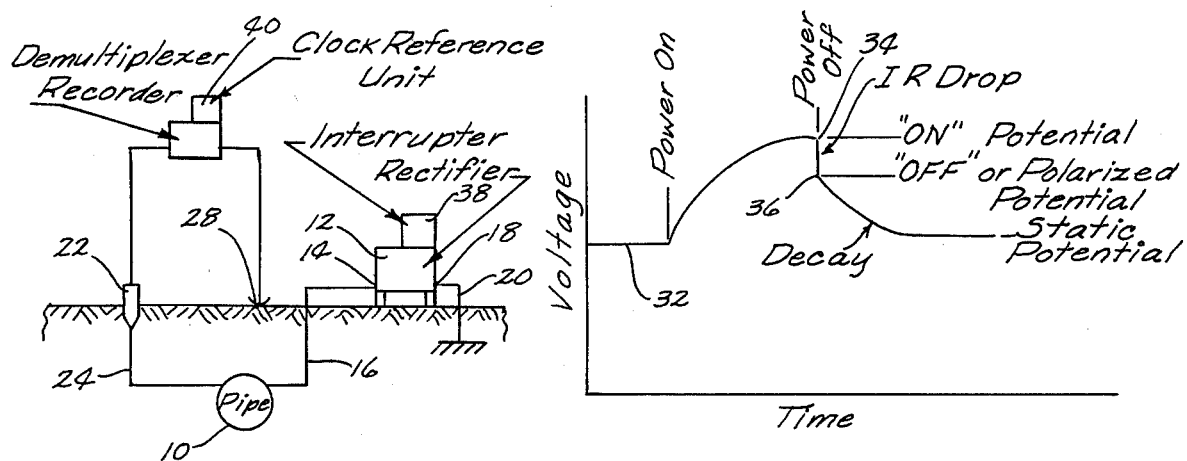
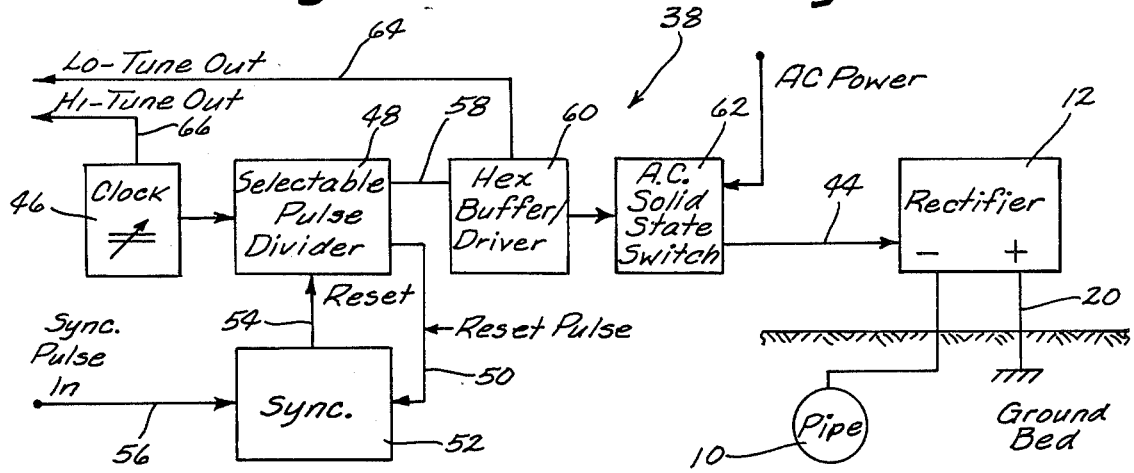
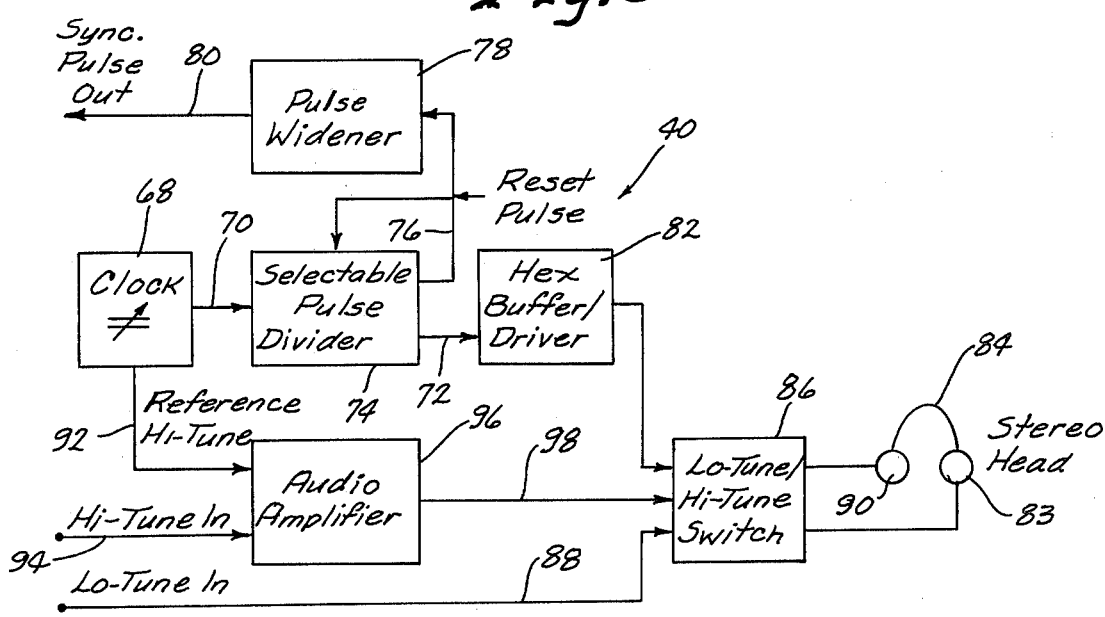

TEST SYSTEM FOR CATHODIC PROTECTION CIRCUIT OF AN UNDERGROUND PIPELINE

BACKGROUND OF THE INVENTION

The present invention is directed generally to a system for testing the cathodic protection circuit of an underground steel, cast iron or ductile iron structure and more particularly to a practical system for measuring the polarized potential along a buried steel, cast iron or ductile iron pipeline.

Buried pipelines are commonly used for transporting certain fluids including natural gas, for example. The buried metallic pipe is coated to prevent external corrosion but the coating deteriorates in time and furthermore, the corrosion process is accelerated at any exposed areas of the coated pipe such as at the cuts or openings in the coating. To prevent corrosion, DC rectifiers are situated in spaced-apart relationship along the pipeline, perhaps one-half to thirty miles apart depending on the condition of the pipeline. The cathode of each rectifier is connected to the pipeline with the anode connected to ground.

The U.S. Department of Transportation has established minimum pipeline safety standards relating to minimum allowable potentials applied to the pipelines. Accordingly, there is a need to measure the pipeline potential in order to determine if the standards are met.

Briefly, cathodic protection is acceptable according to the government standards if it meets any one of at least five criteria. The first criteria is a minimum negative 850 millivolt pipe-to-soil potential with reference to a copper/copper sulfate half cell. This is referred to herein as the "ON" potential. For a new well-coated pipeline, this voltage can be economically maintained and tested using conventional methods.

For older lines with much exposed metal, however, the current loss at the exposed areas makes it far too expensive to maintain the 850 mV ON potential. Accordingly, a second criteria may be used which requires at least a 300 mV difference between the ON and static potentials of the pipeline. The static potential is the initial potential before any protective current is applied or the final potential after the protective current is turned off and the potential is fully depolarized. Again, both of these readings can be taken by conventional methods to determine if the second criteria is met. Sometimes, a third criteria may be met when neither of the first or second criteria are met. The third criteria requires a minimum 100 mV negative polarization voltage shift. The polarization voltage shift is determined by interrupting the protective current. Upon interruption, an immediate pipe-to-soil potential shift occurs. The potential after the shift is the polarized potential or instant off potential. This is referred to herein as the "OFF" potential. The difference between the polarized potential and the static potential is the polarization voltage shift.

Conventional testing procedures cannot be practically used for measuring the polarized potential of a pipeline. All of the rectifiers applying a current to a given length of pipe would have to be shut off. The potential measuring could then be advanced only a short distance before the potential of the pipe begins to decay or depolarize back to its static potential since depolarization begins immediately after the protective current is shut off. Accordingly, the equipment would have to stop, wait for the rectifiers to restore the potential of the pipe, and then proceed to test another short distance. The present invention enables the polarized potential to be recorded as easily as the ON potential.

SUMMARY OF THE INVENTION

The apparatus for testing the pipe-to-soil potential of a buried pipeline according to the present invention includes a plurality of synchronous rectifier current interrupters, a synchronous ON/OFF pipe-to-soil potential demultiplexer and a clock reference unit. The output of each cathodic protection rectifier affecting the pipe-to-soil potential survey area is controlled by a synchronous rectifier current interrupter. The function of the interrupter is to turn the rectifier on and off at specified intervals. Each interrupter unit is synchronized to the clock reference unit so that all of the rectifiers are turned on and off in unison. The synchronous ON/OFF potential demultiplexer receives the pipe-to-soil potential signals from a sensing device and electronically separates the ON and OFF potentials. The demultiplexer is also synchronized with the clock reference unit to enable the separation of the ON and OFF potentials.

With the OFF time kept very small, depolarization of the pipe-to-soil potential is substantially prevented. As a result, the OFF potential is essentially the polarized potential and a recording of the ON and polarized potentials is obtained. By comparing the static potentials of the same survey area to the polarized potentials, it can then be easily determined if the third criteria for minimum allowable pipeline potentials is met.

The method according to the present invention thus includes alternately turning the rectifiers on and off in synchronization with one another, producing signals indicative of the pipe-to-soil potential of the pipe when the rectifiers are both on and off, separating the signals indicative of the ON and OFF potentials and synchronizing the separating step with the turning on and off of the rectifiers. The signals indicative of the ON and OFF potentials may then be separately recorded.

BRIEF DESCRIPTION OF THE DRAWINGS

FIG. 2 is an electrical schematic diagram of the testing system of FIG. 1;

FIG. 4 is a graph displaying the potential of a buried pipe under varying circumstances;

FIG. 5 is an electrical block diagram disclosing the synchronous rectifier current interrupter;

FIG. 6 is an electrical block diagram showing the clock reference unit; and

DESCRIPTION OF THE PREFERRED EMBODIMENT

Figure 1:
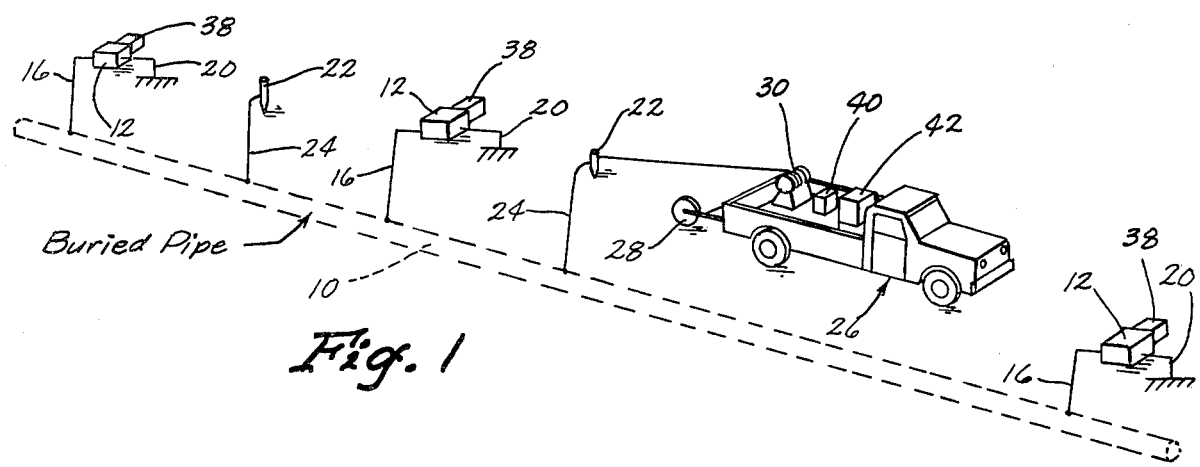
FIG. 1 is a diagrammatic illustration of the system wherein the demultiplexer and recorder are carried in a truck traversing the ground above a buried pipe.

In FIGS. 1 and 2, there is shown a buried pipe 10 having a plurality of DC rectifiers 12 situated in spaced-apart relationship along the pipeline for applying cathodic protection to it. Whereas the rectifiers may be spaced as close together as one-half mile on a pipeline having a deteriorating coating, they may be spaced thirty miles apart on a well-coated pipeline. The cathode 14 of each rectifier is electrically connected by a cable 16 to the pipe 10 and the anode 18 of the rectifier is electrically connected by a cable 20 to ground. Also spaced along the pipe 10 are terminal posts 22 which provide access to a wire 24 which is in electrical contact with the pipe 10.

Figure 3:
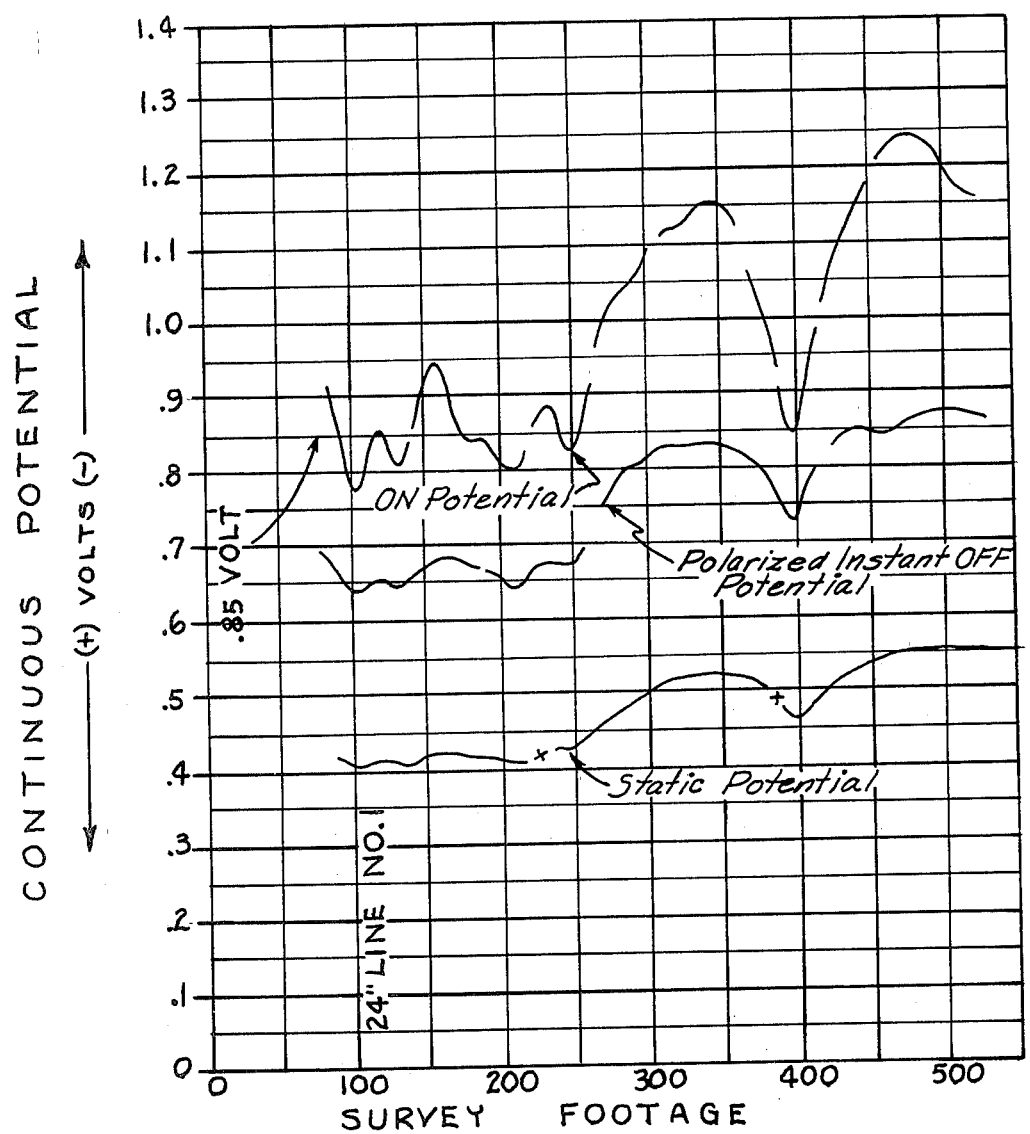
FIG. 3 is a portion of a graph showing the output of the recorder.

In the current method of testing the pipeline potential, a truck 26 is driven along the top of the pipeline. The truck carries a half cell battery contact wheel 28 which establishes electrical contact with the ground when disposed in rolling engagement thereon. A large spool of wire 30 enables the truck to maintain direct electrical connection to terminal post 22 and thus pipe 10. As the truck is advanced, readings are charted on a graph as shown in FIG. 3 with the ON potential being recorded.

Note that a truck is one possible means of transporting the measuring equipment. Another method is holding the equipment stationary and moving just the reference cell. This is sometimes done. Another way is carrying the equipment as a backpack.

The static potential can be recorded in the same manner by shutting off the power to the rectifiers 12 and allowing the pipe 10 to sufficiently depolarize for a couple of days.

The static potential is the naturally occurring potential of the pipe due primarily to the difference in material between the pipe and surrounding soil. FIG. 3 discloses a log showing the static potential in relation to the ON potential. The polarized instant OFF potential indicated in FIG. 3 is the potential of the pipe immediately after the power is turned off, but before the pipe has depolarized. This can be more clearly understood with reference to FIG. 4.

When a pipe is laid in the ground, it assumes a static potential indicated by line 32 in FIG. 4. When a current is applied by the rectifiers 12 at the time indicated as Power ON, the pipe gradually becomes polarized and assumes the ON potential indicated at 34. When the rectifiers are turned off at the time indicated Power OFF, the potential immediately drops to the OFF or polarized potential indicated at 36 due to the IR drop primarily attributable to the resistance of the soil through which the current is applied. If the power remains off, the pipeline potential slowly decays back to the static potential as shown.

The present invention is directed to a practical apparatus and method for measuring the polarized potential along a buried pipe. In FIG. 1, it is seen that the apparatus of the present invention includes a plurality of synchronous rectifier current interrupters 38, each of which is electrically connected to a respective one of the rectifiers 12 for turning the rectifier on and off at intervals. A clock reference unit 40 is electrically connectable to each of the interrupters 38 one at a time for synchronizing each respective interrupter 38 with the clock reference unit whereby, upon synchronization of all of the interrupters 38, all of the rectifiers 12 are turned on and off in unison.

A portable sensing device including the contact reference half cell 28 is carried on the truck for producing signals indicative of the pipe-to-soil potentials of the pipe as the truck is advanced therealong. Signals from the sensing device are directed to a synchronous ON-/OFF pipe-to-soil potential demultiplexer 42 which may be electrically connected to a conventional two channel recorder.

The demultiplexer 42 is also adapted for temporary electrical connection to the clock reference unit 40 so that it may be synchronized with the clock reference unit 40 and interrupters 38 for operatively separating signals indicative of the ON and OFF potentials respectively. The demultiplexer is electrically connected to the recorder for recording the signals indicative of the ON and OFF potentials on separate channels of the recorder.

The interrupter 38 is electrically connected to a rectifier 12 as indicated in FIG. 5. The interrupter 38 controls the rectifier's AC input 44 at the fuse box thus controlling its output. A time interval is selected for the interrupter which is used to control the ON and OFF times. An ON period of 80% to 90% is desirable to avoid excessive pipe polarization potential decay during the OFF period.

In FIG. 5, it is seen that the interrupter 38 includes a crystal-controlled clock unit 46, the output of which is a 60 Hertz square-wave signal which is fed to a Selectable Pulse Divider 48. Divider 48 controls the ON/OFF period and consists of a twelve-stage CMOS binary counter and two banks of eight mini-switches. The binary counter is an IC chip which contains twelve flip-flop circuits in series. Each flip-flop is a divide-by-two counter. That is, for every two input pulses there is one output pulse of the same time period as the two input pulses combined. When the 60 Hertz (60 pulses per second or 0.01667 seconds per pulse) is fed into the first flip-flop, the output is 30 Hertz (30 pulses per second of 0.03333 seconds per pulse). The 30 Hertz is then fed to another flip-flop and so on. The output of each flip-flop is terminated at one of the pins of the IC chip. Using mini-switches, various possible combinations of flip-flop outputs can be selected for a desired ON/OFF period.

The output from the Selectable Pulse Divider 48 after the mini-switches is a single pulse of so much time low (zero volts) and of so much time high (plus 5 volts). At the end of the cycle, the negative going edge of the pulse is directed through line 50 to the Sync circuit 52 and through line 54 back to reset the counter to zero. An external Sync pulse can also be introduced at 56 to override the internal reset pulse and reset the counter.

The output pulse of divider 48 after the mini-switches is fed through line 58 to a Buffer/Driver 60 which, because of its higher current capabilities, is used to control the Solid State Switch 62. The Buffer/Driver 60 is used as a current Sync. That is, 5 volts is connected directly to the "+" terminal of the Solid State Switch 62 while the "−" terminal is connected to the output of the Buffer/Driver. When the output of the Buffer/Driver 60 is +5 volts, the AC switch is OFF. But when the output of the Buffer/Driver 60 is zero volts, this sinks or grounds the "−" terminal of the AC switch 62 which turns the switch ON. The AC switch 62 then controls the AC to the rectifier 12.

Another pulse signal at 64 (Lo-Tune Out) identical to that fed to the AC switch 62 becomes an output and is used to drive the left side of a stereo head phone referred to hereinbelow. A 3.58 MHZ signal at 66 (Hi-Tune Out) from the crystal-control clock unit 46 is also available as an aid when turning the clock frequency.

The clock reference unit 40 which is shown in FIG. 6, is very similar in operation to the interrupter 38. A crystal-control clock unit 68 is used to provide the 60 Hertz square-wave signal at 70 which in turn is divided down to obtain a lower frequency output at 72 by a Selectable Pulse Divider 74 just as in the circuit of interrupter 38.

Similarly, the reset pulse at 76 is used to reset the counter to zero after completion of each cycle but without going through a Sync circuit. The reset pulse of the clock reference unit 40 is also used to synchronize the interrupters 38 and demultiplexer 42 by overriding their own internal reset pulses. This is done by first widening and reshaping the reference reset pulse since it is normally very narrow. The Pulse Widener circuit 78 is a one-shot multivibrator which when triggered by the reference reset pulse, supplies an output pulse at 80 of desired duration. This output pulse is used to synchronize all other units with the timing circuit of the clock reference unit 40.

As in the interrupter 38, the output of the Selectable Pulse Divider 74 at 72 is fed into three parallel Buffer/Drivers 82. The Drivers 82 are capable of driving the right side 83 of the stereo head phone 84, as shown in FIG. 6, when the Lo-Tune/Hi-Tune Switch 86 is set to Lo-Tune. Via a cable including wires 88, 80 and 94 connecting the other units to the clock reference unit 40, the Lo-Tune output of the other units is fed to the left side 90 of the stereo head phone 84. Listening to the stereo phones 84 reveals if the unit under test is in Sync with the clock reference unit 40.

In addition, the Hi-Tune outputs (3.58 MHZ) of the clock unit 68 at 92 and the unit under test as at 94 are compared by injecting these signals through an Audio Amplifier 96. The output of the Audio Amplifier 96 at 98 is the beat frequency of difference of the two input signals. This audio output drives the stereo head phone 84 directly. When the clock frequency of the unit under test is tuned to the clock frequency of the clock reference unit 40, the output of the stereo head phone 84 is essentially zero (no beat) except for background noise.

Figure 7:
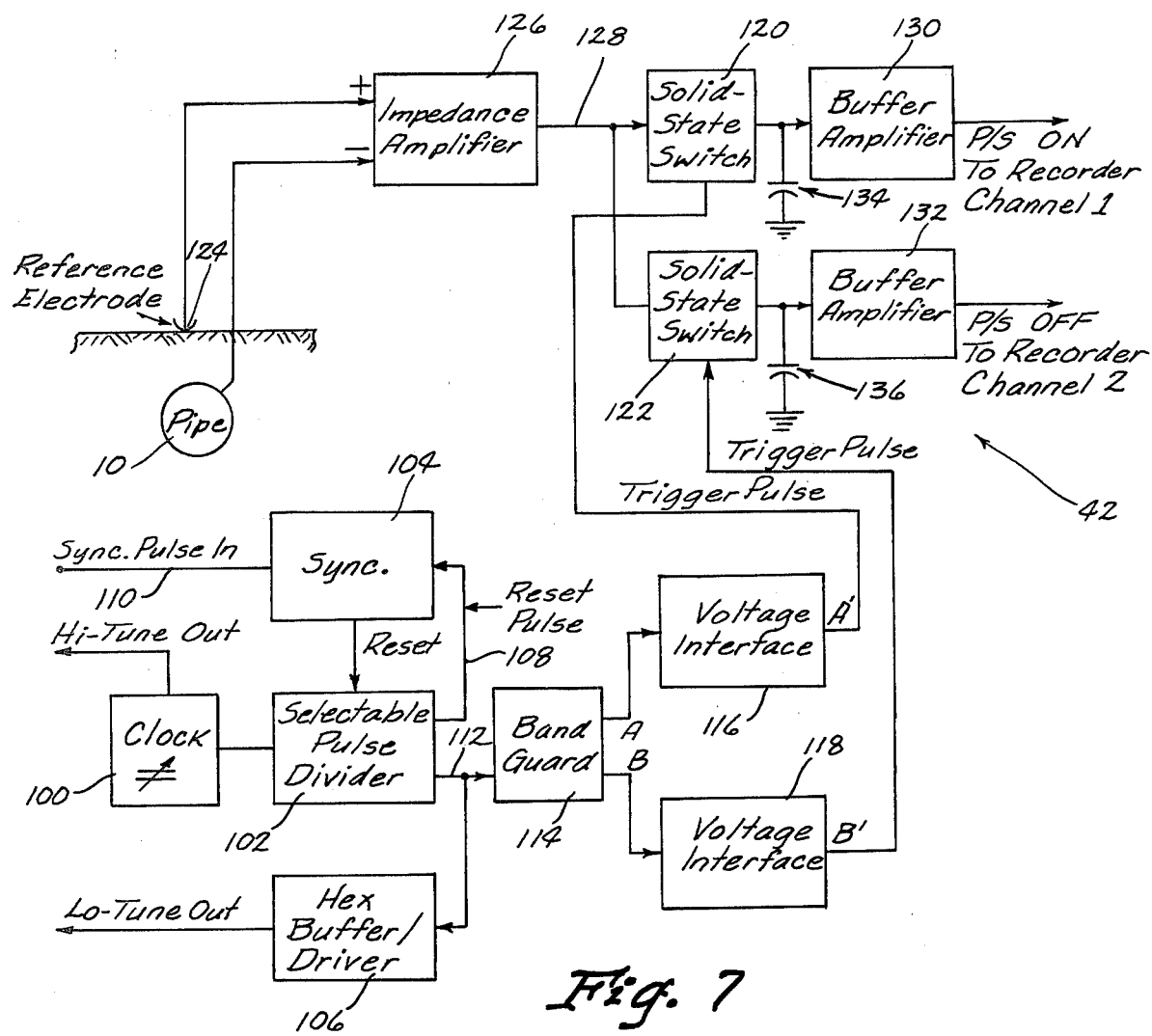
FIG. 7 is an electrical block diagram showing the synchronous ON/OFF pipe-to-soil potential demultiplexer.

The synchronous ON/OFF pipe-to-soil potential demultiplexer 42 is shown in FIG. 7. Like the interrupter 38, the demultiplexer 42 contains a crystal-controlled clock unit 100, a Selectable Pulse Divider 102, a Sync 104 and a Buffer/Driver 106. The output of the Selectable Pulse Divider 102 at 108 is synchronized with the clock reference unit 40 via a cable, including wires 110, Hi-Tune and Lo-Tune, connecting the demultiplexer 42 and clock reference unit 40. The output of the pulse divider 102 at 112 is fed to a band guard 114 which provides a dead band during the ON to OFF and OFF to ON transition of the interrupters 38. This allows time for the rectifier currents to stabilize before a potential reading is taken.

Outputs A and B are directed to separate voltage interface networks 116 and 118 to convert the signal to a voltage compatible with that used by the Solid State switches 120 and 122 respectively. Each voltage interface circuit consists of a voltage comparator with a dual ($\pm V$) voltage power supply. The input to the voltage comparator from the band guard 114 is one polarity only with respect to ground. Since the Solid State Switches 120 and 122 must be capable of passing both positive and negative analog inputs, the interface networks provide the necessary trigger voltages.

The analog pipe-to-soil potential signals are obtained in the usual manner using a copper/copper sulfate reference electrode indicated at 124 in FIG. 7. This potential between the reference electrode and pipe 10 is applied to a unity gain impedance amplifier 126 which also acts as a buffer. The same analog output at 128 from the impedance amplifier 126 is fed to both Solid State Switches 120 and 122. As the rectifiers are switched on and off, the ON and OFF potentials are applied to both Solid State Switches 120 and 122. The band guard 114 triggers (through the voltage interfaces 116 and 118) the appropriate Solid State Switch ON such that only the ON analog potential is applied to the ON potential buffer amplifier 130 and the OFF analog potential to the OFF potential buffer amplifier 132. Thus both the ON and OFF potentials are separated and applied to the appropriate buffer amplifier 130 or 132. The capacitors 134 and 136 respectively before the buffer amplifiers 130 and 132 simply hold the DC voltage until the respective Solid State Switch 120 or 122 is triggered on again which then update the voltage. The outputs of the buffer amplifiers 130 and 132 at 138 and 140 respectively are fed to a conventional dual channel recorder (not shown) which will then record both ON and Off pipe-to-soil potentials simultaneously. The outputs of each buffer amplifier 130 and 132 can also be read by a volt meter and manually recorded.

The interrupter 38, clock reference unit 40 and demultiplexer 42 are shown in block diagram form in FIGS. 5, 6 and 7 since it will be apparent to one skilled in the art that several different specific circuits could be devised for accomplishing the functions set forth in these Figures.

The manner in which the interrupters 38, clock reference unit 40 and demultiplexer 42 are encased is not critical to the present invention. The similar clock units 46, 68 and 100 of the respective units however may be encased in styrofoam to minimize the effects of temperature changes on the crystal. The crystal frequency is temperature sensitive and changes in temperature can increase or decrease the frequency. Thus the housings of the units may be painted white to reflect heat and it is important that the units be kept away from direct sunlight if possible. Normally, if all of the units change in temperature at the same rate, their frequencies will also change at the same rate and will remain in Sync. If excessive frequency differences become a problem, temperature compensated crystal controlled oscillator clocks can be used but the expense and power requirements for such clocks are much greater.

In operation, the clock reference unit is electrically connected one at a time to all of the interrupters associated with rectifiers effecting a test area. Once each interrupter is synchronized, the clock reference unit 40 may be disconnected since its own clock unit 46 will maintain it in Sync with the clock reference unit 40. Likewise, the clock reference unit need only be temporarily connected to the demultiplexer 42 for synchronizing the same. The clock reference unit 40 should remain ON during the entire test however in the event that it may be needed for resynchronizing particular units if necessary.

The two channel recorder will produce a continuous output log of a form similar to that shown in FIG. 3 wherein both the ON and polarized OFF potentials are simultaneously recorded. By superimposing conventionally recorded static potential measurements onto the log, the difference between the polarized potential and static potential at all positions along the pipe may be easily read to determine if the above-mentioned third criteria for acceptable cathodic protection is met. If so, it would then be unnecessary to maintain the minimum negative 850 millivolt pipe-to-soil potential required by the first criteria with the resultant substantial savings in energy consumption.

Thus there has been shown and described a test system for the cathodic protection circuit of an underground pipeline which provides a practical means for measuring the polarized potential along a buried pipeline.

I claim:

1. An apparatus for testing the pipe-to-soil potential of a buried pipeline having a plurality of rectifiers electrically connected to it at spaced apart intervals for applying an electrical potential to said pipe, comprising
   a plurality of synchronous rectifier current interrupters, each interrupter adapted for electrical connection to a respective one of said rectifiers for turning said rectifier on and off at intervals,
   a clock reference unit electrically connectable to each of said interrupters for synchronizing each interrupter with the reference unit whereby, upon synchronization of all said interrupters, all of said rectifiers are turned on and off in unison,
   a portable sensing device operative for producing signals indicative of the pipe-to-soil potential of a pipe,
   a synchronous ON/OFF pipe-to-soil potential demultiplexer, said demultiplexer being electrically connected to said recording device for electronically separating the on and off potentials,
   said clock reference unit being electrically connectable to said demultiplexer for synchronizing said demultiplexer with the reference unit and interrupters whereby said demultiplexer will operatively separate signals indicative of the ON and OFF potentials respectively, and
   means for separately recording said separated signals.

2. The apparatus of claim 1 wherein each interrupter is electrically connected to the electrical input of a respective rectifier.

3. The apparatus of claim 1 further comprising means for adjusting the on and off time intervals of each on/off cycle of operation of said interrupters.

4. The apparatus of claim 3 wherein said on time interval is greater than seventy percent and less than one hundred percent of each on/off cycle.

5. The apparatus of claim 1 wherein each of said interrupters, clock reference unit, and demultiplexer include similar crystal controlled clock units.

6. The apparatus of claim 5 further comprising means for synchronizing the clock units of said interrupters and demultiplexer with the clock unit of said clock reference unit.

7. The apparatus of claim 6 wherein said means for synchronizing the clock units comprises a stereo headphone having opposite sides, means for electrically connecting one side to the said clock reference unit and means for connecting the other side to any one of said interrupters and demultiplexer.

8. The apparatus of claim 1 wherein said means for separately recording said separated signals comprises a two channel recorder and means for electrically connecting said demultiplexer to said recorder for recording the signals indicative of the ON and OFF potentials on separate channels of said recorder.

9. A method for testing the pipe-to-soil potential of buried pipeline having a plurality of rectifiers electrically connected to it at spaced apart intervals for applying an electrical potential to said pipe, comprising
   alternately turning each rectifier on and off,
   synchronizing the turning on and off of each rectifier whereby, upon synchronization, all of said rectifiers are turned on and off in unison,
   producing signals indicative of the pipe-to-soil potential of a pipe at various positions along said pipe when the rectifiers are both on and off thereby to produce signals indicative of the ON and OFF potentials of the pipe,
   separating the signals indicative of the ON and OFF potentials of the pipe,
   synchronizing said separating step with the turning on and off of each rectifier, and
   separately recording the signals indicative of the ON and OFF potentials of the pipe.

10. The method of claim 9 further comprising selecting on and off time intervals for said interrupters, said on interval comprising more than seventy percent and less than one hundred percent of each on/off cycle.

11. The method of claim 9 wherein said recording step comprises producing a log of the ON and OFF potentials of the pipe and further comprising superimposing readings of the static potential of the pipe onto said log.

* * * * *